United States Patent [19]

Echigo et al.

[11] Patent Number: 5,719,253

[45] Date of Patent: Feb. 17, 1998

[54] POLY(AMIC ACID) SOLUTION AND POLYIMIDE FILM OR POLYIMIDE-COATED MATERIAL OBTAINED THEREFROM

[75] Inventors: Yoshiaki Echigo; Shoji Okamoto; Hiroshi Yamada; Isao Tomioka; Yoshiaki Iwaya, all of Kyoto, Japan

[73] Assignee: Unitika Ltd., Hyogo, Japan

[21] Appl. No.: 539,740

[22] Filed: Oct. 5, 1995

[30] Foreign Application Priority Data

Oct. 7, 1994 [JP] Japan ................... 6-243719

[51] Int. Cl.⁶ ..................... C08G 73/10; C08K 5/17
[52] U.S. Cl. ................ 528/182; 528/183; 528/188; 528/351; 528/353
[58] Field of Search ..................... 528/182, 184, 528/188, 350, 351, 353

[56] References Cited

U.S. PATENT DOCUMENTS

| | | | |
|---|---|---|---|
| 5,070,181 | 12/1991 | Kawai et al. | 528/351 |
| 5,241,041 | 8/1993 | Choi et al. | 528/188 |
| 5,300,619 | 4/1994 | Okada et al. | 528/350 |
| 5,466,732 | 11/1995 | Tomioka et al. | 524/113 |

*Primary Examiner*—Tae Yoon
*Attorney, Agent, or Firm*—Sughrue, Mion, Zinn, Macpeak & Seas, PPLC

[57] ABSTRACT

This invention provides a poly(amic acid) solution which does not contain aprotic polar solvents such as DMF, NMP, DMAc, DMSO, as well as a polyimide film obtained therefrom having appropriate flexibility and a small coefficient of linear thermal expansion and a coated material in which the polyimide film is formed on a substrate.

More particularly, it provides a poly(amic acid) solution which has an aromatic poly(amic acid) and a tertiary amine as the solute and a water soluble alcohol compound and/or a water soluble ether compound as the solvent and contains substantially no aprotic polar solvent, as well as a polyimide film obtained from the poly(amic acid) solution and a coated material obtained by forming the film on a substrate.

5 Claims, No Drawings

POLY(AMIC ACID) SOLUTION AND POLYIMIDE FILM OR POLYIMIDE-COATED MATERIAL OBTAINED THEREFROM

FIELD OF THE INVENTION

This invention relates to a poly(amic acid) solution and a polyimide film obtained therefrom or a polyimide-coated material obtained by forming the film on a substrate.

BACKGROUND OF THE INVENTION

Polyimides are excellent in heat resistance and mechanical strength and are used widely as films, coating materials, moldings and the like. A typical polyimide, poly(4,4'-oxydiphenylenepyromellitimide), is obtained by polymerizing 4,4'-diaminodiphenyl ether with pyromellitic dianhydride and is widely used as insulation materials for flexible printed circuits (FPC), semiconductors and the like. This polyimide is excellent in heat resistance and mechanical characteristics and has appropriate flexibility, but has poor thermal dimensional stability which causes a problem in that when a film of poly(4,4'-oxydiphenylenepyromellitimide) is directly formed on a substrate such as a copper foil, warpage and considerable curling occur in the resulting polyimide-coated material due to differences in the coefficients of linear thermal expansion between the substrate and the film.

In general, it is known that a polyimide film having a small coefficient of linear thermal expansion is obtained when a monomer showing stiffness as a molecule is introduced into a polymer chain, and a polyimide film excellent in flexibility is obtained when a monomer showing flexibility as a molecule is introduced into a polymer molecular chain. However, when a monomer showing stiffness is introduced into a polymer chain, the flexibility of the resulting film becomes poor. As a consequence, in order to obtain a polyimide film having a small coefficient of linear thermal expansion while maintaining proper flexibility, a number of studies have been made on the formation of copolymers from various combinations of monomers excellent in stiffness and other monomers excellent in flexibility.

As an example of such copolymers, JP-B-3-20131 discloses polyimide films obtained from biphenyltetracarboxylic dianhydride and pyromellitic dianhydride as the tetracarboxylic dianhydride component and paraphenylenediamine and 4,4'-diaminodiphenyl ether as the diamine component (the term "JP-B" as used herein means an "examined Japanese patent publication"). Also, JP-A-1-131,241, JP-A-1-131,242, JP-A-1-131,243, JP-A-1-131,244 and JP-A-1-98,628 disclose polyimides in which pyromellitic dianhydride as the tetracarboxylic dianhydride component and 4,4'-diaminodiphenyl ether and 3,3'-dimethylbenzidine as the diamine component, or pyromellitic dianhydride as the tetracarboxylic dianhydride component and 4,4'-diaminodiphenyl ether and paraphenylenediamine as the diamine component, are regularly made into alternating copolymers (the term "JP-A" as used herein means an "unexamined published Japanese patent application").

In addition, JP-A-3-46,292 discloses an FPC in which a polyimide obtained by copolymerizing pyromellitic dianhydride as the tetracarboxylic dianhydride component with 4,4'-diaminodiphenyl ether and paraphenylenediamine as the diamine component is directly bound to a metallic foil, and JP-B-4-57,389 discloses a process for the production of a polyimide-metallic foil composite film in which a metallic foil is directly bonded with a polyimide obtained by copolymerizing 3,3'-biphenyltetracarboxylic dianhydride or a derivative thereof as the tetracarboxylic dianhydride component with paraphenylenediamine and a diamine containing silicon atoms, as well as 4,4'-diaminodiphenyl ether as the occasion demands, as the diamine component.

When a polyimide is bonded to a metallic foil, it is necessary to reduce the coefficient of linear thermal expansion of the polyimide to that of the metallic foil and increase the ratio of stiff monomers in the polymer chains, which result in decreased flexibility. In the case of FPC and the like which require flexibility, it is desirable to reduce the coefficient of linear thermal expansion while simultaneously keeping the ratio of stiff monomers low.

The coefficient of linear thermal expansion of polyimide films largely relates not only to monomer originated stiffness but also to the in-plane orientation degree of polymer chains as described in the following references. For example, *ACS Polym. Preprints*, vol. 30, no. 2, pp. 156–157 (1989), describes the relationship between the packing or in-plane orientation degree of molecular chains and the coefficient of linear thermal expansion when a poly(amic acid) film is subjected to a chemical or thermal cyclization treatment, stating that, in the case of poly(4,4'-oxydiphenylenepyromellitimide) containing flexible monomers, the in-plane orientation degree of polymer chains is harmed when a thermal cyclization treatment is carried out, which results in a tendency of its coefficient of linear thermal expansion to increase, in comparison with the case of chemical cyclization treatment.

Also, *J. Polym. Sci., B, Polym. Phys.*, vol. 32, pp. 1271–1283 (1994), describes the relationship between film thickness and the in-plane orientation degree and coefficient of linear thermal expansion and states that the in-plane orientation degree tends to increase and the coefficient of linear thermal expansion tends to become small when film thickness is reduced.

In addition, *Advances in Polyimide Science and Technology* (Tecnnomic Publishing Co., Inc.), pp. 360–374 (1991), describes the relationship between increasing the rate of temperature in thermal cyclization treatment and the in-plane orientation degree of polymer chains and the coefficient of linear thermal expansion and states that a lower rate of increasing temperature results in a higher in-plane orientation degree and a smaller coefficient of linear thermal expansion.

The aforementioned relationship between cyclization treatment and the in-plane orientation degree of polymer chains is affected by the solvent in which a poly(amic acid) is dissolved. That is, the solvent systems usually used in the polymerization of poly(amic acid) are aprotic polar solvents such as N,N-dimethylformamide (DMF), N-methyl-2-pyrrolidone (NMP), N,N-dimethylacetamide (DMAc), dimethyl sulfoxide (DMSO) and the like, all of which strongly solvate with poly(amic acid) due to their strong interaction as described in *J. Polym. Sci.*, A, vol. 4, pp. 2607–2626 (1966), *J. Polym. Sci.*, A, vol. 25, pp. 2005–2020 (1987), *J. Polym. Sci.*, A, vol. 25, pp. 2479–2491 (1987), *Kogyo Kagaku Zasshi (Journal of Industrial Chemistry)*, vol. 71, no. 9, pp. 1559–1564, and Abstract of Papers, ANTEC '91, pp. 1742–1745. Therefore, it is difficult to remove these aprotic polar solvents when poly(amic acid) films are formed from solutions of poly(amic acid) in such solvents. If an aprotic polar solvent remains in a poly(amic acid) film, the aprotic polar solvent plasticizes the poly(amic acid) film when the film is subjected to thermal cyclization treatment which results in easy movement and frequent rearrangement of polymer chains, thus resulting in a tendency to obtain a polyimide film having a low in-plane orientation degree, as has been pointed out in *Polym. Eng. Sci.*, vol. 29, pp. 347–351 (1989) and Advances in *Polyimide Science and Technology*, Tecnnomic Publishing Co., Inc., pp. 360–374 (1991).

On the other hand, the inventors of the present invention have found a unique solvent system which overcomes the aforementioned problems caused by aprotic polar solvents and disclosed, in JP-A-6-1,915, an invention concerning a poly(amic acid) solution which does not use an aprotic polar solvent, and also found that a poly(4,4'-oxydiphenylenepyromellitimide) film obtained from the poly(amic acid) solution has small coefficient of linear thermal expansion in comparison with the case of the use of the aforementioned aprotic polar solvents and proposed an invention, based on this finding, in Japanese Patent Application No. 5-285,620. When bound directly to metallic foil and the like, however, a coefficient of linear thermal expansion similar to those of a metallic foil and the like was not obtained.

On the other hand, JP-A-3-160,780 discloses a process for the production of an FPC in which a polyimide film is formed on a metallic foil, the film being obtained from a solution prepared by adding a heterocyclic tertiary amine (e.g., pyridine, picoline or the like) to a solution of a poly(amic acid) obtained by the copolymerization of pyromellitic dianhydride as the tetracarboxylic dianhydride component with 4,4'-diaminodiphenyl ether and paraphenylenediamine as the diamine component. *J. Polym. Sci.*, A-1, vol. 4, pp. 2607–2616 (1966) describes that the imidizaion rate becomes high by the addition of a tertiary amine so that the in-plane orientation degree is improved and the coefficient of linear thermal expansion is reduced. According to these production processes, a polyimide film having excellent thermal dimensional stability is obtained when a tertiary amine is added to the solution, in comparison with the case where the tertiary amine is absent. However, since the aforementioned aprotic polar solvents are used as the solvent of the poly(amic acid) solutions in these processes, it is possible that the remaining aprotic polar solvent will act negatively upon the in-plane orientation of polymer chains when cyclization treatment is carried out. Accordingly, these processes cannot reduce the coefficient of linear thermal expansion to a proper level while simultaneously insuring a low ratio of monomers having stiffness.

In addition, an aqueous solution which comprises a poly(amic acid) as a polyimide precursor and a tertiary amine is disclosed in British Patent 1,207,577. In this patent, the aqueous solution of poly(amic acid) and tertiary amine is produced by a process in which a poly(amic acid) solution is prepared using an aprotic polar solvent as the polymerization solvent, and the poly(amic acid) is isolated from the solution as a solid and dissolved in a mixture composed of a tertiary amine, an alcohol and water. Also, JP-B-57-10,897 discloses a process in which an aqueous solution comprising a poly(amic acid) and a tertiary amine is produced by adding the tertiary amine, water, N-methylpyrrolidone and furfuryl alcohol to the poly(amic acid). These poly(amic acid) aqueous solutions, however, have the problems caused by aprotic polar solvents as described in the foregoing.

SUMMARY OF THE INVENTION

In view of the above, it therefore becomes an object of the present invention to provide a poly(amic acid) solution which contains substantially no aprotic polar solvent and to provide a polyimide film obtained therefrom having proper flexibility and small coefficient of linear thermal expansion as well as a polyimide-coated material in which such a polyimide film is formed on a substrate.

With the aim of overcoming the aforementioned problems involved in the prior art, the inventors of the present invention have conducted intensive studies and found that (1) an aromatic poly(amic acid) and a tertiary amine compound dissolve in a water soluble alcohol compound and/or a water soluble ether compound so that a poly(amic acid) solution containing substantially no aprotic polar solvent can be obtained and (2) a polyimide film obtained from the poly(amic acid) solution or a polyimide-coated material in which this film is formed on a substrate have proper flexibility (e.g., more than 5% in elongation) and small coefficient of linear thermal expansion. The present invention has been accomplished on the basis of these findings.

Thus, according to a first aspect of the present invention, there is provided a solution which comprises an aromatic poly(amic acid) and a tertiary amine compound as the solute and a water soluble alcohol compound and/or a water soluble ether compound as the solvent, where said solution contains substantially no aprotic polar solvent.

The term "substantially no aprotic polar solvent" means less than 0.1% by weight aprotic polar solvent based on the total weight.

According to a second aspect of the present invention, there is provided a polyimide film which comprises pyromellitic dianhydride as the polyimide forming dianhydride component and 50 to 83 mol % of diaminodiphenyl ether and 17 to 50 mol % of paraphenylenediamine as the polyimide forming diamine component, where said film has a coefficient of linear thermal expansion of $2.5\times10^{-5}/°$ C. or less at 30° to 250° C. and contains substantially no aprotic polar solvent.

According to a third aspect of the present invention, there is provided a polyimide-coated material in which a polyimide film is formed on a substrate, where said polyimide film comprises pyromellitic dianhydride as the polyimide forming dianhydride component and 50 to 83 mol % of diaminodiphenyl ether and 17 to 50 mol % of paraphenylenediamine as the polyimide forming diamine component, has a coefficient of linear thermal expansion of $2.5\times10^{-5}/°$ C. or less at 30° to 250° C. and contains substantially no aprotic polar solvent.

Other objects and advantages of the present invention will be made apparent as the description progresses.

DETAILED DESCRIPTION OF THE INVENTION

Poly(amic acid) Solution

Aromatic Poly(amic acid)

The term "aromatic poly(amic acid)" as used herein means a poly(amic acid) which comprises an aromatic tetracarboxylic dianhydride and an aromatic diamine, in which the dianhydride component is preferably pyromellitic dianhydride and/or benzophenonetetracarboxylic dianhydride, more preferably pyromellitic dianhydride, and the diamine component is preferably diaminodiphenyl ether and/or paraphenylenediamine, more preferably 50 to 83 mol % of diaminodiphenyl ether and 17 to 50 mol % of paraphenylenediamine. If the amount of diaminodiphenyl ether as a diamine component is smaller than 50 mol %, this would cause brittleness in the resulting polyimide film and if it is larger than 83 mol %, this would not yield a polyimide film having a coefficient of linear thermal expansion of less than $2.5\times10^{-5}/°$ C. Generally, the coefficient of linear thermal expansion of 0 is ideal but preferable results can be obtained when this value is $2.5 \times 10^{-5}/°$ C. or less. Practical range of the coefficient of linear thermal expansion is from $1.0 \times 10^{-5}/°$ C. to $2.5 \times 10^{-5}/°$ C.

The preferred ratio between the dianhydride and diamine in the aromatic poly(amic acid) is from 1:0.95 to 1:1.05 by mol ratio.

Intrinsic viscosity [η] is a value directly related to the molecular weight of polymers, and the poly(amic acid) of the present invention should have an intrinsic viscosity [η] of preferably 0.3 or more, more preferably 0.7 or more, most preferably 1.0 or more. Though not particularly restricted, the preferred upper limit on [η] may be 6. If the intrinsic viscosity [η] is smaller than 0.3, this would not provide a film having sufficient strength.

The intrinsic viscosity [η] can be calculated using the following formula, by preparing a 0.5% by weight (based on solution weight) solution of the poly(amic acid) in N,N-dimethylacetamide as a solvent and separately measuring the time the polymer solution and the solvent alone need to flow (at 30° C.) through a constant volume capillary of a master viscometer. In the following formula, C is the concentration of the poly(amic acid).

$$[\eta] = \frac{\ln \frac{\text{flow time of solution}}{\text{flow time of solvent}}}{C}$$

Tertiary Amine Compound

Examples of the tertiary amine compound include a tertiary amine compound which has an alkyl group of 1 to 20 carbon atoms and a tertiary amine compound which has an unsaturated alkyl group of 5 to 20 carbon atoms.

Illustrative examples of the tertiary amine compound having an alkyl group of 1 to 20 carbon atoms include trimethylamine, triethylamine, tri-n-propylamine, tri-n-butylamine, methyldiethylamine, dimethyl-n-propylamine, N,N-dimethylhexylamine (C6N), N,N-dimethyloctylamine (C8N), N,N-dimethyldecylamine (C10N), N,N-dimethyldodecylamine (C12N), N,N-dimethyltetradecylamine (C14N), N,N-dimethylhexadecylamine (C16N), N,N-dimethyloctadecylamine (C18N), N,N-dibutyl-2-ethylhexylamine, 3-dimethylaminopropanol, N-isobutylethanolamine, dimethyl-3-methoxypropylamine, N,N,N',N'-tetramethyl-1,2-diaminoethane, N,N,N',N'-tetramethyldiaminopropane, N,N,N',N",N"-pentamethyldiethylenetriamine, N,N-dimethylbenzylamine, dimethylaminoacetoaldehyde diethylacetal, 2-dimethylaminoethyl acetate and the like.

Illustrative examples of the tertiary amine compound having an unsaturated alkyl group include triallylamine, N,N-dimethylallylamine, N-methyldiallylamine, N,N,N',N'-tetraallyl-1,4-diaminobutane, dimethylaminoethyl methacrylate, dimethylaminoethyl acrylate, diethylaminoethyl acrylate and the like.

These tertiary amines may be used alone or as a mixture of two or more.

Water Soluble Alcohol Compound

Illustrative examples of the water soluble alcohol compound include methanol (MeOH), ethanol, 1-propanol, 2-propanol, tert-butyl alcohol, ethylene glycol, 1,2-propanediol, 1,3-propanediol, 1,3-butanediol, 1,4-butanediol, 2,3-butanediol, 1,5-pentanediol, 2-butene-1,4-diol, 2-methyl-2,4-pentanediol glycerol, 2-ethyl-2-hydroxymethyl-1,3-propanediol, 1,2,6-hexanetriol and the like, of which MeOH is preferred. These water soluble alcohols may be used alone or as a mixture of two or more.

Water Soluble Ether Compound

Illustrative examples of the water soluble ether compound include tetrahydrofuran (THF), dioxane, trioxane, 1,2-dimethoxyethane, diethylene glycol dimethyl ether, diethylene glycol diethyl ether, 2-methoxyethanol, 2-ethoxyethanol, 2-(methoxymethoxy) ethoxyethanol, 2-isopropoxyethanol, 2-butoxyethanol, tetrahydrofurfuryl alcohol, diethylene glycol, diethylene glycol monomethyl ether, diethylene glycol monoethyl ether, diethylene glycol monobutyl ether, triethylene glycol, triethylene glycol monoethyl ether, tetraethylene glycol, 1-methoxy-2-propanol, 1-ethoxy-2-propanol, dipropylene glycol, dipropylene glycol monomethyl ether, dipropylene glycol monoethyl ether, tripropylene glycol monomethyl ether, polyethylene glycol, polypropylene glycol and the like, of which 2-methoxyethanol and tetrahydrofurfuryl alcohol, and the like, of which THF is preferred. These water soluble ethers may be used alone or as a mixture of two or more. Further, a mixture of such water soluble ethers and alcohols may be used as a solvent.

Aprotic Polar Solvent

The term "aprotic polar solvent" as used herein means an aprotic polar solvent which has a boiling point of 100° C. to 300° C. and a dipole moment of 3.0 debye to 20 debye, such as the aforementioned DMF, NMP, DMAc and DMSO, as well as hexamethylenephosphoramide (HMPA), N-methylcaprolactam, N-acetyl-2-pyrrolidone and the like. These aprotic polar solvents are not substantially present in the poly(amic acid) solution and the polyimide film of the present invention).

Production of the Solution

The poly(amic acid) solution of the present invention can be produced by completely dissolving a poly(amic acid) and a tertiary amine in a water soluble alcohol compound and/or a water soluble ether compound.

The concentration of the poly(amic acid) in the poly(amic acid) solution of the present invention may be in the range of preferably from 0.1 to 60% by weight based on solution weight, more preferably from 1 to 25% by weight based on solution weight. If the concentration is smaller than 0.1% by weight or larger than 60% by weight, a uniform film can hardly be obtained.

The tertiary amine may preferably be used in an amount of from 0.2 to 3.0 equivalent, more preferably from 0.25 to 2.0 equivalent, to the carboxyl group(s) of poly(amic acid). The poly(amic acid) has 2 equivalent of carboxyl groups per one repeating unit. If the amount is smaller than 0.2 equivalent or larger than 3.0 equivalent, a uniform solution can hardly be obtained.

According to the present invention, the poly(amic acid) solution is produced in the aforementioned manner, and it is desirable to use a poly(amic acid) obtained by polymerizing an aromatic tetracarboxylic dianhydride with an aromatic diamine compound in a solvent which does not contain any aprotic polar solvent. Illustrative examples of such polymerization solvents include water soluble organic solvents such as acetone, THF, acetonitrile and the like, of which acetone and THF are particularly preferred.

When the polymerization is carried out in such a solvent, the poly(amic acid) is formed as a suspension and precipitated in the reaction system, whereafter the suspension of precipitated poly(amic acid) is filtered to obtain poly(amic acid) powder having 1 to 500 μm of average particle size. Thereafter, the thus obtained poly(amic acid) powder and a tertiary amine are dissolved in a water soluble alcohol compound and/or a water soluble ether compound to produce the desired poly(amic acid) solution.

A mixed solvent of THF and MeOH or THF and water may also be used as the polymerization solvent. When the polymerization reaction is carried out in such a mixed solvent, the poly(amic acid) does not precipitate in the reaction system, but the desired poly(amic acid) solution can be produced by adding a tertiary amine to the reaction system.

Polyimide Film or Polyimide-Coated Material

Polyimide

The term "polyimide" as used herein means an organic polymer in which at least 70 mol %, preferably 100 mol %, of the repeating unit of its main chain has the imide structure. When the polyimide is copolymerized, it may be any copolymer such as a random copolymer, a block copolymer, an alternating copolymer or the like.

The above-described poly(amic acid) may be prepared by the methods described in EP-A-532,053, EP-A-532,954, and corresponding U.S. patent applications thereof, herein incorporated by reference.

Examples of the copolymer include (1) a copolymer obtained from two or more types of carboxylic dianhydride and one type of diamine, (2) a copolymer obtained from one type of carboxylic anhydride and two or more types of diamine, and (3) a copolymer obtained from two or more types of carboxylic dianhydride and two or more types of diamine. It is preferable to use three or four types of monomers.

Then, the repeating unit of the poly(amic acid) and that of the polyimide are shown below. The 100% imidized compound means that 100% of the polymer has the repeating unit (2) and the 70% imidized compound means that 70% of the polymer has the repeating unit (2) and 30% of the polymer has the repeating unit (1).

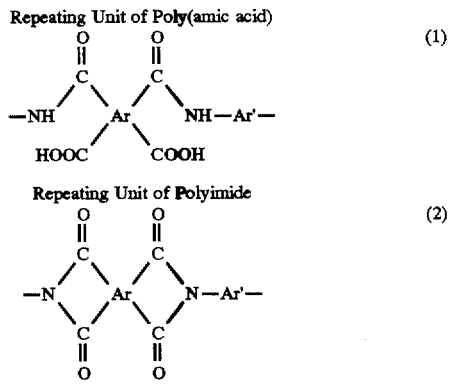

(wherein Ar represents a tetravalent aromatic residue derived from the aromatic tetracarboxylic anhydride and Ar' represents a divalent aromatic residue derived from the aromatic diamine).

Polyimide Film or Polyimide-Coated Material

A poly(amic acid) film or a poly(amic acid) coated material prepared by forming the poly(amic acid) film on a substrate is produced in a conventional way from the poly(amic acid) solution obtained in the aforementioned manner, and the poly(amic acid) film-comprising poly(amic acid) is subjected to a cyclization treatment to obtain a polyimide film or a polyimide-coated material.

The polyimide film or polyimide-coated material can be produced, for example, in the following manner.

(1) The poly(amic acid) solution is applied to or is coated on the surface of a substrate such as glass, a metal or the like and dried at 10° to 80° C. for 0.1 to 4 hours to obtain a poly(amic acid) coated material in which a poly(amic acid) film is formed on the substrate. Thereafter, the poly(amic acid) film is separated from the substrate, fixed on a frame or the like and then heated at 150° to 300° C. for 0.5 to 5 hours or the poly(amic acid) film is soaked in a cyclization agent composed of acetic anhydride and pyridine for 1 to 20 hours at 10° to 40° C.) to effect imidization, thereby obtaining a polyimide film.

(2) A polyimide-coated material is obtained by heating the above poly(amic acid) coated material at 150° to 300° C. for 0.5 to 5 hours without separating the poly(amic acid) film from the substrate or by soaking the poly(amic acid) coated material in a cyclization agent composed of acetic anhydride and pyridine for 1 to 20 hours at 10° to 40° C.).

The above-described steps (1) and (2) are carried out in an atmosphere of an inert gas such as air, nitrogen gas, and argon gas.

(3) A polyimide film can also be obtained by separating it from the polyimide-coated material obtained in (2).

The coefficient of linear thermal expansion of the polyimide film (including the polyimide film of the polyimide-coated material) at 30° to 250° C. is less than $2.5 \times 10^{-5}/°$ C. Practical range of the coefficient of linear thermal expansion is from $1.0 \times 10^{-5}/°$ C. to $2.5 \times 10^{-5}/°$ C. When the polyimide film is formed on the substrate, the coefficient of linear thermal expansion of the polyimide film may preferably be the same as or similar to that of the substrate. When the coefficient of linear thermal expansion is $2.5 \times 10^{-5}/°$ C. or more, the film shows poor thermal dimensional stability which causes wrinkling, warpage and the like in a coated material where the film is integrated with a substrate. Also, an amount of diaminodiphenyl ether exceeding 83 mol % will increase the coefficient of linear thermal expansion of the polyimide film to $2.5 \times 10^{-5}/°$ C. or more.

The thickness of the polyimide film is preferably 1 to 500 μm, more preferably 20 to 200 μm.

Substrate

Illustrative examples of the substrate include metallic foils, metal wires, glass, semiconductors and the like. Examples of the metal include gold, silver, copper, aluminum and the like. The use of copper as the substrate is particularly effective as an insulation material for FPC.

Since a water soluble alcohol compound and/or water soluble ether compound is used as the solvent in the poly(amic acid) solution of the present invention, the solvent can be removed easily at the time of molding for films, sheets, fibers, molded parts and coating so that amount of the solvent remaining in the resulting poly(amic acid) film is extremely small. The amount of remaining solvent is 100 ppm or less. Also, since the poly(amic acid) film obtained from the poly(amic acid) solution of the present invention contains a tertiary amine, a rapid imidization rate is obtained which results in an improved in-plane orientation degree of polymer chains and a smaller coefficient of linear thermal expansion in comparison with poly(amic acid) films that contain no tertiary amine. Also, the orientation degree of the molecular chains is not harmed, because the film does not contain aprotic polar solvents (e.g., DMF, NMP, DMAc, DMSO) which soften the film and accelerate the rearrangement of molecular chains at the time of imidization. In addition, the stiffness of the film can be suppressed to obtain proper flexibility by limiting the ratio of the stiff monomer (for example, paraphenylenediamine) in the polymer.

Thus, a polyimide film having proper flexibility and a small coefficient of linear thermal expansion is obtained from the poly(amic acid) solution of the present invention. Also, in the case of the polyimide-coated material, its coefficient of linear thermal expansion can be controlled by adjusting the paradiphenylamine component in the polymer, so that the coefficient of linear thermal expansion can be matched with that of the substrate to prevent warpage and curling.

For example, when aluminium is used as the substrate, the coefficient of linear thermal expansion of the polyimide film can be matched to that of aluminium (i.e., $2.4 \times 10^{-5}/°$ C.) by controlling the amount of the paraphenylene diamine component in the polymer. When copper is used as the substrate, the coefficient of linear thermal expansion of the polyimide film can be matched to that of copper (i.e., $1.6 \times 10^{-5}/°$ C.) in the same manner.

Examples of the present invention are given below by way of illustration and not by way of limitation.

In this connection, the term "coefficient of linear thermal expansion" as used herein means a coefficient of linear thermal expansion in the same film direction at 30° to 250° C., which can be calculated by the following formula wherein $T_1$ is the lower limit temperature (30° C.), $T_2$ is the upper limit temperature (250° C.), $l_1$ is the film length at $T_1$ and $l_2$ is the film length at $T_2$.

$$\text{Coefficient of linear thermal expansion} = \frac{(l_2 - l_1)}{(T_2 - T_1) \times l_1}$$

The coefficient of linear thermal expansion was measured by using a Thermo Mechanical Analyzer (manufactured by Perkin-Elmer). Each polyimide film was cut into a size of 3.0 mm in width and 13.0 mm in length. Chucks were attached to the film 1.5 mm from each end of the film in the lengthwise direction so that the chucks were spaced 10 mm apart; changes in the length of the film were measured by drawing one of the chucks at a load of 10 g/mm² and heating the film at the temperature increasing rate of 10° C./min, thereby permitting one to calculate the coefficient of linear thermal expansion using the above formula.

Molecular weights and molecular weight distributions can be determined using a Hitachi GPC system equipped with a Hitachi RI detector and a Hitachi Kasei column (GL-S300MDT-5) in DMF/LiBr/H3PO4/THF at 35° C. Molecular weight calculations are based on polystyrene standards.

The viscosity of the solution was measured at 20° C. by using a Brookfield viscometer (TOKIMEC model DVL-BII manufactured by Tokimec Co.).

Unless otherwise indicated, all stirrings and like procedures in the following Comparative Examples and Examples were at room temperature.

Unless otherwise indicated, all operations in the following Comparative Examples and Examples were conducted in the atmosphere.

COMPARATIVE EXAMPLE 1

A 42.23 g portion of diaminodiphenyl ether was dissolved in a mixed solvent of 400.0 g THF and 100.0 g MeOH, and the resulting solution was maintained at 30° C. To this solution was added 47.39 g of pyromellitic dianhydride in one portion, followed by 1 hour of stirring to obtain a uniform yellow liquid. The poly(amic acid) in the thus obtained poly(amic acid) solution had an intrinsic viscosity of 1.4.

The poly(amic acid) solution obtained in this manner was uniformly coated to a thickness of 400 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 1.

COMPARATIVE EXAMPLE 2

A 42.23 g portion of diaminodiphenyl ether was dissolved in 500.0 g of DMF, and the resulting solution was maintained at 30° C. A 47.39 g portion of pyromellitic dianhydride was added to the solution in one portion, and the mixture was stirred for 1 hour, mixed further with 295.0 g of DMF and again stirred for 1 hour to obtain a uniform yellow liquid. The poly(amic acid) in the thus obtained poly(amic acid) solution had an intrinsic viscosity of 2.1.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 1.

COMPARATIVE EXAMPLE 3

A 42.23 g portion of diaminodiphenyl ether was dissolved in 500.0 g of DMAc, and the resulting solution was maintained at 30° C. A 47.39 g portion of pyromellitic dianhydride was added to the solution in one portion, and the mixture was stirred for 1 hour, mixed further with 295.0 g of DMF and again stirred for 1 hour to obtain a uniform yellow liquid. The poly(amic acid) in the thus obtained poly(amic acid) solution had an intrinsic viscosity of 1.9.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 1.

COMPARATIVE EXAMPLE 4

A commercially available poly(amic acid) solution (Pyre ML, manufactured by Dupont) containing a poly(amic acid) prepared from diaminodiphenyl ether and pyromellitic dianhydride as the solute and NMP as the solvent was uniformly coated to a thickness of 400 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness, flexibility and coefficient of linear thermal expansion at 30° to 250° C. of the polyimide film are shown in Table 1.

COMPARATIVE EXAMPLE 5

A 5.0 g portion of triethylamine was added to 100.0 g of the solution obtained in Comparative Example 3, and the mixture was stirred for 1 hour to obtain a yellow solution.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 1.

COMPARATIVE EXAMPLE 6

A 50 g portion of NMP was added to 100 g of a commercially available poly(amic acid) solution (Pyre ML, manufactured by Dupont) containing a poly(amic acid) prepared from diaminodiphenyl ether and pyromellitic dianhydride as the solute and NMP as the solvent, and the mixture was further mixed with 5.0 g of triethylamine and stirred for 1 hour to obtain a yellow solution.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 1.

COMPARATIVE EXAMPLE 7

A 4.6 g portion of 2-picoline was added to 100.0 g of the solution obtained in Comparative Example 2, and the mixture was stirred for 1 hour to obtain a yellow solution.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 1.

COMPARATIVE EXAMPLE 8

A 4.6 g portion of 2-picoline was added to 100.0 g of the solution obtained in Comparative Example 3, and the mixture was stirred for 1 hour to obtain a yellow solution.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 1.

COMPARATIVE EXAMPLE 9

A 50 g portion of NMP was added to 100 g of a commercially available poly(amic acid) solution (Pyre ML, manufactured by Dupont) containing a poly(amic acid) prepared from diaminodiphenyl ether and pyromellitic dianhydride as the solute and NMP as the solvent, and the mixture was further mixed with 4.5 g of 2-picoline and stirred for 1 hour to obtain a yellow solution.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 1.

COMPARATIVE EXAMPLE 10

A 27.33 g portion of diaminodiphenyl ether was dissolved in 400.0 g of DMF, and the resulting solution was maintained at 5° C. To this was added 40.69 g of pyromellitic dianhydride in one portion, followed by 1 hour of stirring. This was further mixed with 4.92 g of paraphenylenediamine and stirred for 3 hours. The molar ratio of diaminodiphenyl ether to paraphenylenediamine was 3:1. The resulting solution was mixed with 256.5 g of DMF and the stirring was continued for 1 hour to obtain a uniform yellow solution. The poly(amic acid) in the thus obtained poly(amic acid) solution had an intrinsic viscosity of 1.2.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 1.

COMPARATIVE EXAMPLE 11

A 27.33 g portion of diaminodiphenyl ether and 4.92 g of paraphenylenediamine were dissolved in a mixed solvent of 320.0 g THF and 80.0 g MeOH, and the resulting solution was maintained at 5° C. To this solution was added 40.69 g of pyromellitic dianhydride in one portion, followed by 1 hour of stirring. The molar ratio of diaminodiphenyl ether to paraphenylenediamine was 3:1. The resulting solution was mixed with 256.5 g of MeOH and stirred for 1 hour to obtain a uniform yellow liquid. The poly(amic acid) in the thus obtained poly(amic acid) solution had an intrinsic viscosity of 0.9. This solution was used in Examples 1, 2 and 3.

The poly(amic acid) solution obtained in this manner was uniformly coated to a thickness of 600 µm at a rate of 40 mm/sec on the treated surface of a one side-treated 35 µm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 1.

COMPARATIVE EXAMPLE 12

A 16.82 g portion of diaminodiphenyl ether and 3.89 g of paraphenylenediamine were dissolved in a mixed solvent of 240.0 g THF and 60.0 g MeOH, and the resulting solution was maintained at 5° C. To this solution was added 26.96 g of pyromellitic dianhydride in one portion, followed by 1 hour of stirring. The molar ratio of diaminodiphenyl ether to paraphenylenediamine was 7:3. The resulting solution was mixed with 130.0 g of MeOH and stirred for 1 hour to obtain a uniform yellow liquid. The poly(amic acid) in the thus obtained poly(amic acid) solution had an intrinsic viscosity of 0.9. This solution was used in Example 4.

The poly(amic acid) solution obtained in this manner was uniformly coated to a thickness of 600 µm at a rate of 40 mm/sec on the treated surface of a one side-treated 35 µm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 1.

COMPARATIVE EXAMPLE 13

A 16.82 g portion of diaminodiphenyl ether was dissolved in a mixed solvent of 240.0 g THF and 60.0 g MeOH, and the resulting solution was maintained at 5° C. To this solution was added 26.17 g of pyromellitic dianhydride in one portion, followed by 1 hour of stirring. This was mixed with 3.89 g of paraphenylenediamine dissolved in 30.0 g of MeOH, stirred for 1 hour and then further mixed with 80.0 g of THF and 20.0 g of MeOH. Molar ratio of diaminodiphenyl ether to paraphenylenediamine was 7:3. The poly (amic acid) in the thus obtained poly(amic acid) solution had an intrinsic viscosity of 0.8. This solution was used in Example 5.

The poly(amic acid) solution obtained in this manner was uniformly coated to a thickness of 600 µm at a rate of 40 mm/sec on the treated surface of a one side-treated 35 µm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 1.

EXAMPLE 1

A 5.2 g portion of triethylamine was added to 100.0 g of the solution obtained in Comparative Example 11 and the mixture was stirred for 2 hours to obtain a uniform yellow solution.

The poly(amic acid) solution obtained in this manner was uniformly coated to a thickness of 600 µm at a rate of 40 mm/sec on the treated surface of a one side-treated 35 µm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 2.

EXAMPLE 2

A 8.0 g portion of C8N was added to 100.0 g of the solution obtained in Comparative Example 11 and the mixture was stirred for 2 hours to obtain a uniform yellow solution.

The poly(amic acid) solution obtained in this manner was uniformly coated to a thickness of 600 µm at a rate of 40 mm/sec on the treated surface of a one side-treated 35 µm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 2.

EXAMPLE 3

A 9.5 g portion of C10N was added to 100.0 g of the solution obtained in Comparative Example 11 and the mixture was stirred for 2 hours to obtain a uniform yellow solution.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 2.

EXAMPLE 4

A 14.0 g portion of C16N was added to 100.0 g of the solution obtained in Comparative Example 12 and the mixture was stirred for 2 hours to obtain a uniform yellow solution.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 2.

EXAMPLE 5

A 14.0 g portion of C16N was added to 100.0 g of the solution obtained in Comparative Example 13 and the mixture was stirred for 2 hours to obtain a uniform yellow solution.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 2.

EXAMPLE 6

A 15.22 g portion of diaminodiphenyl ether and 4.11 g of paraphenylenediamine were dissolved in a mixed solvent of 200.0 g THF and 50.0 g MeOH, and the resulting solution was maintained at 5° C. To this solution was added 25.44 g of pyromellitic dianhydride in one portion, followed by 1 hour of stirring followed by the addition of 152.8 g MeOH which was followed by an additional 1 hour of stirring. The molar ratio of diaminodiphenyl ether to paraphenylenediamine was 2:1. A 100.0 g portion of the resulting solution was mixed with 5.3 g of triethylamine and stirred for 2 hours to obtain a uniform yellow liquid. The poly(amic acid) in the thus obtained poly(amic acid) solution had an intrinsic viscosity of 0.9.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 2.

EXAMPLE 7

A 15.22 g portion of diaminodiphenyl ether and 4.11 g of paraphenylenediamine were dissolved in a mixed solvent of 200.0 g THF and 50.0 g MeOH, and the resulting solution was maintained at 5° C. A 25.44 g portion of pyromellitic dianhydride was added in one portion to the solution, and the mixture was stirred for 1 hour, mixed further with 152.8 g of MeOH and then stirred for an additional 1 hour. The molar ratio of diaminodiphenyl ether to paraphenylenediamine was 2:1. To a 100.0 g portion of the resulting solution was added 8.2 g of C8N, followed by 2 hours of stirring to obtain a uniform yellow solution. The poly(amic acid) in the thus obtained poly(amic acid) solution had an intrinsic viscosity of 0.9.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 2.

EXAMPLE 8

A 15.22 g portion of diaminodiphenyl ether and 4.11 g of paraphenylenediamine were dissolved in a mixed solvent of 200.0 g THF and 50.0 g MeOH, and the resulting solution was maintained at 5° C. A 25.44 g portion of pyromellitic dianhydride was added in one portion to the thus prepared solution, and the mixture was stirred for 1 hour, further mixed with 152.8 g of MeOH and again stirred for 1 hour. The molar ratio of diaminodiphenyl ether to paraphenylenediamine was 2:1. To 100.0 g of the resulting solution was added 9.7 g of C10N, followed by 2 hours of stirring to obtain a uniform yellow solution. The poly(amic acid) in the thus obtained poly(amic acid) solution had an intrinsic viscosity of 0.9.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 2.

EXAMPLE 9

A 15.22 g portion of diaminodiphenyl ether and 4.11 g of paraphenylenediamine were dissolved in a mixed solvent of 200.0 g THF and 50.0 g MeOH, and the resulting solution was maintained at 5° C. A 25.44 g portion of pyromellitic dianhydride was added in one portion to the thus prepared solution, and the mixture was stirred for 1 hour, further mixed with 152.8 g of MeOH and again stirred for 1 hour. The molar ratio of diaminodiphenyl ether to paraphenylenediamine was 2:1. To 100.0 g of the resulting solution was added 14.0 g of C16N, followed by 2 hours of stirring to obtain a uniform yellow solution. The poly(amic acid) in the thus obtained poly(amic acid) solution had an intrinsic viscosity of 0.9.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 2.

EXAMPLE 10

A 33.63 g portion of diaminodiphenyl ether and 12.11 g of paraphenylenediamine were dissolved in a mixed solvent of 560.0 g THF and 140.0 g MeOH, and the resulting solution was maintained at 5° C. A 62.91 g portion of pyromellitic dianhydride was added in one portion to the thus prepared solution, and the mixture was stirred for 1 hour, further mixed with 278 g of MeOH and again stirred for 1 hour. The molar ratio of diaminodiphenyl ether to paraphenylenediamine was 6:4. To 100.0 g of the resulting solution was added 9.8 g of C10N, followed by 2 hours of stirring to obtain a uniform yellow solution. The poly(amic acid) in the thus obtained poly(amic acid) solution had an intrinsic viscosity of 0.9.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 2.

EXAMPLE 11

A 33.63 g portion of diaminodiphenyl ether and 12.11 g of paraphenylenediamine were dissolved in a mixed solvent of 560.0 g THF and 140.0 g MeOH, and the resulting solution was maintained at 5° C. A 62.91 g portion of pyromellitic dianhydride was added in one portion to the thus prepared solution, and the mixture was stirred for 1 hour, further mixed with 278 g of MeOH and again stirred for 1 hour. The molar ratio of diaminodiphenyl ether to paraphenylenediamine was 6:4. To 100.0 g of the resulting solution was added 14.3 g of C16N, followed by 2 hours of stirring to obtain a uniform yellow solution. The poly(amic acid) in the thus obtained poly(amic acid) solution had an intrinsic viscosity of 0.9.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 2.

EXAMPLE 12

A 27.33 g portion of diaminodiphenyl ether and 4.92 g of paraphenylenediamine were dissolved in a solvent of 552.8 g 2-methoxyethanol, and the resulting solution was maintained at 5° C. A 40.69 g portion of pyromellitic dianhydride was added in one portion to the thus prepared solution, and the mixture was stirred for 2 hours. The molar ratio of diaminodiphenyl ether to paraphenylenediamine was 3:1. To 100.0 g of the resulting solution was added 9.5 g of C10N, followed by 2 hours of stirring to obtain a uniform yellow solution. The poly(amic acid) in the thus obtained poly(amic acid) solution had an intrinsic viscosity of 0.9.

The poly(amic acid) solution obtained in this manner was uniformly coated to a thickness of 600 μm at a rate of 40 mm/sec on the treated surface of a one side-treated 35 μm thick electrolytic copper foil which had been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on solution weight) of ferric chloride, thereby removing copper and obtaining a polyimide film. The thickness and coefficient of linear thermal expansion of the polyimide film are shown in Table 2.

TABLE 1

| (COMPARATIVE EXAMPLES) | | | | | |
|---|---|---|---|---|---|
| Comp. Ex. No. | Mol % (molar ratio) | | Tertiary amine compound | Solvent | Thickness (μm) | Linear expansion*** |
| | DADE* | PDA** | | | | |
| 1 | 100 (1:0) | 0 | — | THF/ MeOH | 27 | 3.18 |
| 2 | 100 (1:0) | 0 | — | DMF | 28 | 3.49 |

TABLE 1-continued (COMPARATIVE EXAMPLES)

| Comp. Ex. No. | Mol % (molar ratio) DADE* | PDA | Tertiary amine compound | Solvent | Thickness (μm) | Linear expansion* |
|---|---|---|---|---|---|---|
| 3 | 100 (1:0) | 0 | — | DMAc | 27 | 3.35 |
| 4 | 100 (1:0) | 0 | — | NMP | 39 | 3.59 |
| 5 | 100 (1:0) | 0 | triethyl-amine | DMAc | 25 | 3.30 |
| 6 | 100 (1:0) | 0 | triethyl-amine | NMP | 25 | 3.59 |
| 7 | 100 (1:0) | 0 | 2-picoline | DMF | 28 | 3.10 |
| 8 | 100 (1:0) | 0 | 2-picoline | DMAc | 23 | 3.10 |
| 9 | 100 (1:0) | 0 | 2-picoline | NMP | 23 | 3.52 |
| 10 | 75 (3:1) | 25 | — | DMF | 24 | 2.67 |
| 11 | 75 (3:1) | 25 | — | THF/MeOH | 28 | 2.92 |
| 12 | 70 (7:3) | 30 | — | THF/MeOH | 20 | 2.69 |
| 13 | 70 (7:3) | 30 | — | THF/MeOH | 26 | 2.97 |

*diaminodiphenyl ether
**paraphenylenediamine
***coefficient of linear thermal expansion (x $10^{-5} °C.^{-1}$)

TABLE 2

(EXAMPLES)

| Ex. No. | Mol% (molar ratio) DADE* | PDA** | Tertiary amine compound | Solvent | Thickness (μm) | Linear expansion*** |
|---|---|---|---|---|---|---|
| 1 | 75 (3:1) | 25 | triethyl-amine | THF/MeOH | 23 | 1.97 |
| 2 | 75 (3:1) | 25 | C8N | THF/MeOH | 29 | 1.90 |
| 3 | 75 (3:1) | 25 | C10N | THF/MeOH | 28 | 1.96 |
| 4 | 70 (7:3) | 30 | C16N | THF/MeOH | 26 | 1.94 |
| 5 | 70 (7:3) | 30 | C16N | THF/MeOH | 25 | 1.89 |
| 6 | 67 (2:1) | 33 | triethyl-amine | THF/MeOH | 22 | 2.07 |
| 7 | 67 (2:1) | 33 | C8N | THF/MeOH | 29 | 1.71 |
| 8 | 67 (2:1) | 33 | C10N | THF/MeOH | 21 | 1.89 |
| 9 | 67 (2:1) | 33 | C16N | THF/MeOH | 20 | 1.70 |
| 10 | 60 (6:4) | 40 | C10N | THF/MeOH | 31 | 1.40 |
| 11 | 60 (6:4) | 40 | C16N | THF/MeOH | 27 | 1.85 |
| 12 | 75 (3:1) | 25 | C10N | 2-methoxy-ethanol | 24 | 1.95 |
| 13 | 100 | 0 | triethyl-amine | MeOH | 30 | 2.03 |
| 14 | 100 | 0 | triethyl-amine | Ethanol | 29 | 1.99 |

*diaminodiphenyl ether
**paraphenylenediamine
***coefficient of linear thermal expansion (x $10^{-5} °C.^{-1}$)

As is clear from Tables 1 and 2, a satisfactory coefficient of linear thermal expansion cannot be obtained if even one condition is not satisfied. That is, a low coefficient of linear thermal expansion cannot be obtained when a tertiary amine compound is not used or when an aprotic polar solvent is used even if a tertiary amine compound is used.

EXAMPLE 13

A 41.71 g (0.191 mol) portion of pyromellitic dianhydride and 770 g of acetone were put into a 3 liter capacity flask and thoroughly stirred to prepare a uniform solution [A]. Separately, 38.29 g (0.191 mol) of diaminodiphenyl ether was dissolved in 1,150 g of acetone to prepare a solution [B]. Over a period of 3 hours, solution [B] was added to solution [A] with stirring at room temperature. The stirring was continued for an additional 24 hours to obtain a poly(amic acid) suspension. Matter in suspension was collected from the suspension by filtration. By repeating the washing and filtration steps twice, a poly(amic acid) powder sample was obtained. This powder contained 66.0% by weight of acetone based on the total weight. The weight average molecular weight of the thus obtained poly(amic acid) was 33,400, and its Mw/Mn value as the molecular weight distribution was 2.01.

A portion of the powder was stirred using a magnetic stirrer while drying under reduced pressure of 10 mmHg at room temperature for 48 hours to obtain poly(amic acid) powder. A 5.70 g portion of the resulting powder, 2.21 g of triethylamine (equivalent to the carboxyl groups of the poly(amic acid)) and 24.17 g of MeOH were put into a 100 ml capacity three neck flask and stirred to obtain a light brown transparent solution. The poly(amic acid) concentration of this solution was 14.2% based on the solution weight, and the viscosity of this solution at 20° C. was 12.3 poise.

The solution obtained in this manner was uniformly coated to a thickness of 600 μm at a rate of 40 mm/sec on the treated surface of a one side-treated 35 μm thick electrolytic copper foil which has been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on the total weight) of ferric chloride, thereby removing copper and obtaining a polyimide film. Thickness and coefficient of linear thermal expansion of the polyimide film are shown in Table 2.

EXAMPLE 14

A 3.56 g (0.163 mol) portion of pyromellitic dianhydride and 64 g of THF were put into a 200 ml capacity flask and thoroughly stirred to prepare uniform solution [A]. Separately, 3.20 g (0.016 mol) of diaminodiphenyl ether was dissolved in 80 g of THF to prepare solution [B]. Over a period of 20 minutes, solution [B] was added to solution [A] with stirring at room temperature. The stirring was continued for an additional 3 hours to obtain a poly(amic acid) suspension. The matter in suspension was collected from the suspension by filtration and washed with a sufficient volume of THF and again filtered. By repeating the washing and filtration steps twice, a poly(amic acid) powder sample was obtained. This powder contained 85.1% by weight of THF based on the total weight. The weight average molecular weight of the thus obtained poly(amic acid) was 197,000, and its Mw/Mn value as the dispersion of molecular weight distribution was 3.39.

The thus prepared powder was stirred using a magnetic stirrer while drying under reduced pressure of 10 mmHg at room temperature for 48 hours to obtain a poly(amic acid)

powder. A 3.92 g portion of the resulting powder, 1.45 g of triethylamine (equivalent to the carboxyl groups of the poly(amic acid)) and 24.58 g of methanol were put into a 100 ml capacity three neck flask and stirred to obtain a light brown transparent solution. The viscosity of this solution at 20° C. was 47 poise.

The solution obtained in this manner was uniformly coated to a thickness of 600 μm at a rate of 40 mm/sec on the treated surface of a one side-treated 35 μm thick electrolytic copper foil which has been fixed on a glass plate. This was dried at room temperature for 10 minutes and then at 80° C. for 6 hours, followed by 3 hours of heating at 300° C. in an atmosphere of nitrogen to effect imidization, thereby obtaining a polyimide-coated copper material. Thereafter, the polyimide-coated copper material was soaked in a solution containing 40% by weight (based on the total weight) of ferric chloride, thereby removing copper and obtaining a polyimide film. Thickness and coefficient of linear thermal expansion of the polyimide film are shown in Table 2.

Thus, as has been described in the foregoing, the poly (amic acid) solution of the present invention does not substantially contain aprotic polar solvents such as DMF, NMP, DMAc, DMSO and the like, rather, the solution contains a water soluble alcohol compound and/or a water soluble ether compound as its solvent, so that the solvent can be removed easily at the time of molding and coating. Also, a poly(amic acid) film obtained from the solution or a poly(amic acid) coated material in which the poly(amic acid) film is formed on a substrate contains 100 ppm or less of remaining solvent. As a consequence, when the poly(amic acid) film is subjected to imidization, rearrangement of polymer molecules hardly occurs and in-plane orientation of molecular chains is hardly harmed, and the imidization rate increases and the coefficient of linear thermal expansion can be reduced effectively due to the presence of a tertiary amine. In addition, the desired flexibility of the film can be maintained by keeping the ratio of the paraphenylenediamine component in the polymer 30 mol % or less, and, in the case of the coated material, a polyimide film having a coefficient of linear thermal expansion similar to that of the substrate, such as a metallic foil or the like, can be formed on the substrate by controlling the paraphenylenediamine component in the polymer.

While the invention has been described in detail and with reference to specific embodiments thereof, it will be apparent to one skilled in the art that various changes and modifications can be made therein without departing from the spirit and scope thereof.

What is claimed is:

1. A poly(amic acid) solution which comprises an aromatic poly(amic acid), a tertiary amine as a solute and a water soluble alcohol and/or a water soluble ether as a solvent, wherein said solution contains substantially no aprotic polar solvent, wherein said tertiary amine is selected from the group consisting of N,N-dimethylhexylamine (C6N), N,N-dimethyloctylamine (C8N), N-N-dimethyldecylamine (C10N), N,N-dimethyldodecylamine (C12N), N,N-dimethyltetradecylamine (C14N), N,N-dimethylhexadecylamine (C16N), N,N-dimethyloctadecylamine (C18N) and N,N-dibutyl-2-ethylhexylamine.

2. The poly(amic acid) solution according to claim 1, wherein said polyamic acid comprises a dianhydride component and a diamine component, and the dianhydride component of said aromatic poly(amic acid) comprises pyromellitic dianhydride and/or benzophenonetetracarboxylic dianhydride and the diamine component comprises diaminodiphenyl ether and/or paraphenylenediamine.

3. The poly(amic acid) solution according to claim 1, wherein said polyamic acid comprises a dianhydride component and a diamine component, and the dianhydride component of said aromatic poly(amic acid) is pyromellitic dianhydride and the diamine component comprises 50 to 83 mol % of diaminodiphenyl ether and 17 to 50 mol % of paraphenylenediamine.

4. The poly(amic acid) solution according to claim 1, wherein said water soluble alcohol is methanol.

5. The poly(amic acid) solution according to claim 1, wherein said water soluble ether is tetrahydrofuran.

* * * * *